(12) United States Patent
Hsu et al.

(10) Patent No.: US 7,023,528 B2
(45) Date of Patent: Apr. 4, 2006

(54) HYBRID ELECTRONIC MASK

(75) Inventors: Louis L. Hsu, Fishkill, NY (US); Carl J. Radens, LaGrangeville, NY (US); Li-Kong Wang, Montvale, NJ (US); Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 191 days.

(21) Appl. No.: 10/167,327

(22) Filed: Jun. 10, 2002

(65) Prior Publication Data

US 2003/0228541 A1   Dec. 11, 2003

(51) Int. Cl.
  *G03B 27/72* (2006.01)
  *G03B 27/54* (2006.01)
  *G03B 27/42* (2006.01)

(52) U.S. Cl. .............................. 355/71; 355/67; 355/53

(58) Field of Classification Search ................. 355/30, 355/53, 67–71, 77; 430/5, 20, 30; 359/224, 359/855; 356/237.2

See application file for complete search history.

(56) References Cited

U.S. PATENT DOCUMENTS

| | | | | |
|---|---|---|---|---|
| 5,363,021 | A | * 11/1994 | MacDonald | 315/366 |
| 5,691,541 | A | * 11/1997 | Ceglio et al. | 250/492.1 |
| 5,998,069 | A | 12/1999 | Cutter et al. | 430/5 |
| 6,020,950 | A | * 2/2000 | Shiraishi | 355/30 |
| 6,060,224 | A | 5/2000 | Sweatt et al. | 430/395 |
| 6,084,656 | A | 7/2000 | Choi et al. | 355/71 |
| 6,498,685 | B1 | * 12/2002 | Johnson | 359/626 |
| 6,504,644 | B1 | * 1/2003 | Sandstrom | 359/291 |
| 6,544,698 | B1 | * 4/2003 | Fries | 430/22 |
| 6,798,438 | B1 | * 9/2004 | Beier et al. | 347/238 |
| 2003/0219572 | A1 | * 11/2003 | Kruit | 428/195.1 |

\* cited by examiner

*Primary Examiner*—Henry Hung Nguyen
(74) *Attorney, Agent, or Firm*—Satheesh K. Karra; Harrington & Smith, LLP

(57) ABSTRACT

An electronically programmable mask for lithography has an array of individually controllable light sources aligned with an array of individually controllable liquid crystals, so that individual pixels may be turned on or off and phase-shifted to provide a desired light intensity distribution on a wafer. The mask may be used in a contact printing mode or in a reduction projection mode.

11 Claims, 9 Drawing Sheets

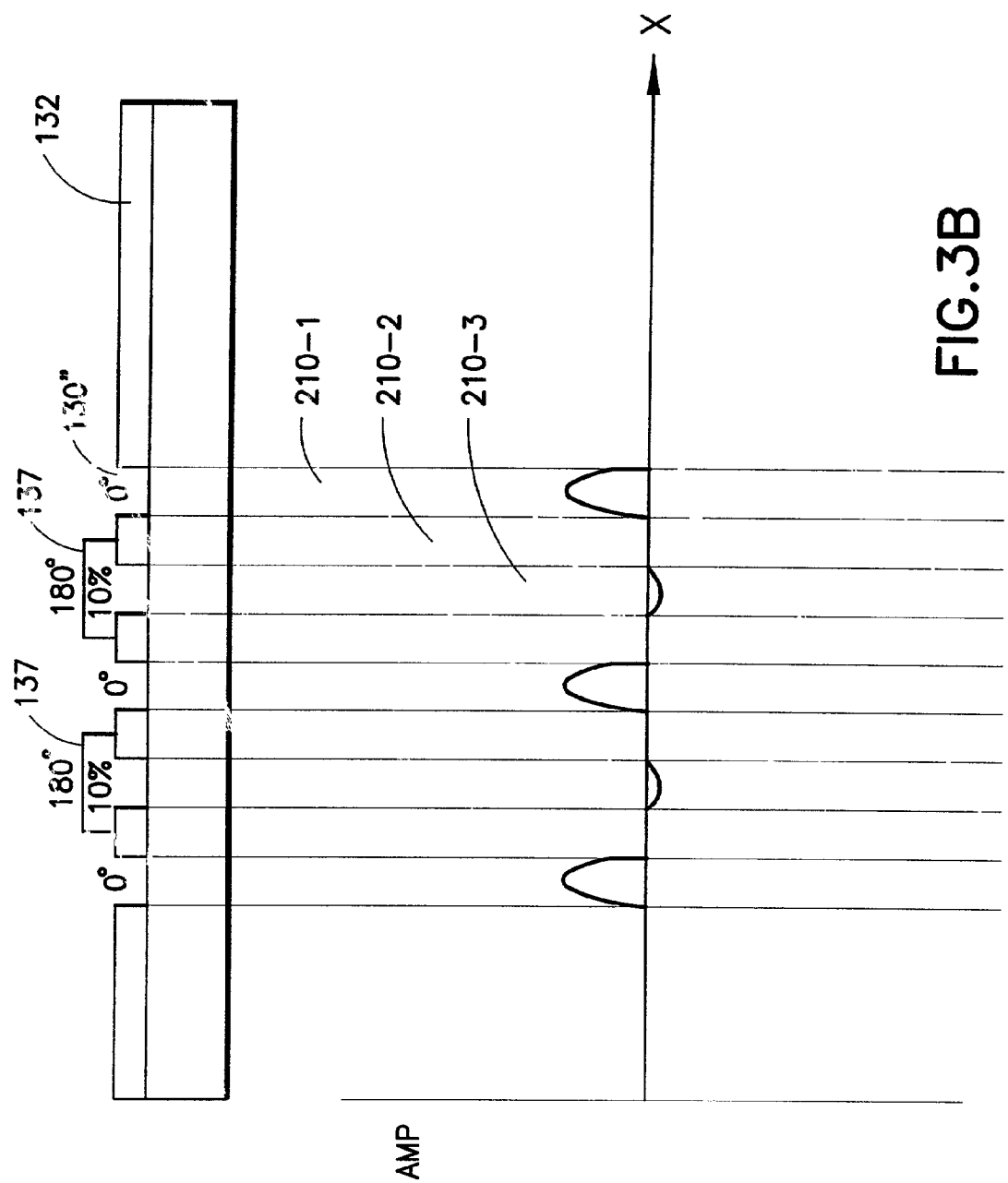

HYBRID ELECTRONIC MASK

TECHNICAL FIELD

The field of the invention is that of mask structures, also referred to as photo masks, used for creating features on surfaces of workpieces employed in semiconductor integrated circuit fabrication or micromachining.

BACKGROUND OF THE INVENTION

A mask is a structure used in photolithography to place a desired image, typically an image of a layer of circuitry, onto a surface of a photoresist layer. Light is selectively passed through the mask and exposes the surface of the photoresist layer with the desired image such that the photoresist layer can be selectively removed, thereby enabling the processing of underlying semiconductor material to form an integrated circuit. Traditional masks include a transparent substrate, e.g., quartz, and light blocking and light passing features formed in an optically opaque material such as chrome. Phase shift masks extend the mask art by providing the ability to alter the phase of light passing through the mask thereby enabling various optical effects, such as constructive and destructive interference, to be used during the exposure of the photoresist. The exposure "light" or radiation may be in the visible regime, in the ultraviolet (UV), deep ultraviolet (DUV), or extreme ultraviolet (EUV) regimes and beyond.

Recently the mask art has been further extended by the introduction of electronically programmable masks. For example, electronically programmable masks are described in U.S. Pat. Nos. 5,998,069 and 6,084,656 which typify a type of photomask that employs a technology similar to that of a liquid crystal display (LCD). The mask is provided with an array of programmable pixels made of optical shutter devices. By a polarization process of liquid crystal material of the photo mask light can be selectively transmitted through portions of the mask. In addition, by using this approach different degrees of phase shifting of the transmitted light can be achieved.

More specifically, U.S. Pat. No. 6,084,656 describes several different approaches to making a programmable mask for optical exposure. A first approach uses a liquid crystal (LC) filter sandwiched between two optically transparent electrodes. Photons coming through a back electrode at selected LC pixels can be either blocked by or passed through the liquid crystal medium and exit to the front electrode, depending on whether the pixels are electrically biased or not. The voltage variable birefringence properties of liquid crystal material are well documented in the literature. A second approach uses an array of micro non-transparent bottom electrodes as optical shutters. These electrodes are electrically actuated. A third approach uses a micro-reflecting plate to deflect light at pixel-level resolutions. The micro-reflecting plate can be activated by an electrostatic or by a thermal expansion force.

U.S. Pat. No. 5,998,069 describes an electronically programmed photolithography mask based on a single array of optical filters, or on a stack of arrays of optical filters, having transmission characteristics whereby the opacity to and polarization of an incident light beam can be modulated electrically. Like U.S. Pat. No. 6,084,656, liquid crystal material is disclosed for use as the filter medium. An advantage of using a stack of liquid crystal filters is that it provides more discrete control of opacity and polarization at the pixel level in order to simulate various intensity and phase shift effects.

Another example of a programmable mask is described in U.S. Pat. No. 6,060,224, which employs an array of addressable and rotatable micro-mirrors. The light can be selectively reflected from certain surfaces of the micro-mirror array to produce useful patterns. As the micro-mirrors are addressed they rotate to reflect light from a remote source onto a portion of a photoresist coated wafer. Multiple layers of micro-mirror arrays can be interleaved to increase the spatial resolution of the resulting transmitted image. In the case of an EUV light source in the range of 4.5 nm to 15 nm wavelength, the micro-mirror elements may be composed of multilayer Bragg reflective coatings that reflect the EUV radiation.

There are at least two major disadvantages in the use of these conventional programmable masks. The first disadvantage is that they require an external light source. This implies that a projection facility and wafer exposure and transporting station are required, as in conventional full-sized conventional lithographic tools. This then further implies an increased cost and complexity, an inflexibility in the exposure scheme, and that the lithographic tool is bulky and difficult to maintain. The second disadvantage is that the heat that absorbed by the mask may damage the electronic devices built into the mask. The accumulated heat may also cause the quality of the mask to be degraded. In other words, the micro-mirrors, or the opaque portions of the liquid crystal mask, will absorb a substantial amount of heat during exposure to the light source. If the heat is not properly dissipated, it can cause the mask to warp, and/or it can induce a mechanical malfunction in the micro-mirror mask. The heat may also degrade the quality of the liquid crystal material.

SUMMARY OF THE INVENTION

The invention relates to an optical system for lithography in which the functions of light generation and light patterning are combined.

A feature of the invention is the generation of a patterned distribution of light across a transverse plane in an optical system.

Another feature of the invention is the combination of light generation and cooling in close proximity, so that heat damage is prevented.

Another feature of the invention is a hybrid electronic mask that uses a combination of a self-emitting mask and a programmable liquid crystal mask.

Yet another feature of the invention is a hybrid electronic mask system includes a mask data storage unit, a compound mask module with a cooling system, a reduction optic and a wafer handling unit.

BRIEF DESCRIPTION OF THE DRAWINGS

FIGS. 3a and 3B show a cross section of another alternative embodiment and associated phase shifts, respectively.

DETAILED DESCRIPTION

Figure 1:
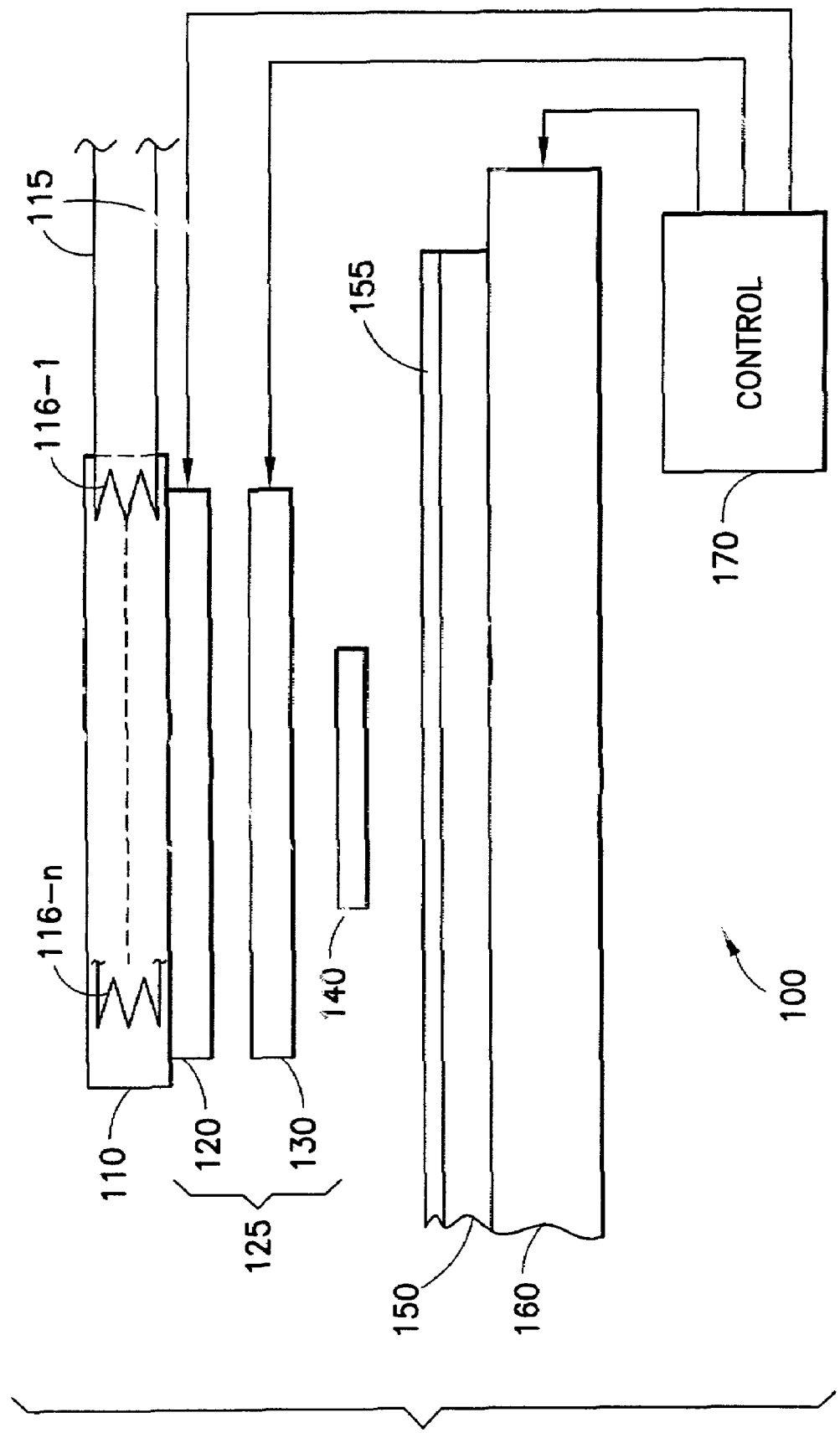
FIG. 1 shows a cross section of an embodiment of the invention.

Reference is made to FIG. 1 for showing in partially pictorial, partially schematic form an embodiment of a lithographic system 100 that includes a mask cooling unit 110 where, for example, a gaseous or a liquid cooling medium 115 is used to control the temperature of a self-emitting mask (SEM) 120. A thermoelectric cooling technique may be used as well.

Illustratively, the SEM includes an array of individually controllable light emitting diodes or other light sources that cover an area of a transverse plane in the system, so that any pixel in the plane may be selectively illuminated and any portion of the mask can emit light with different intensities. The portion where no light is emitted corresponds to an opaque part of the mask where the corresponding area on the photo-resist is not exposed. The portion where 100% of the light intensity is emitted corresponds to a transparent part of the mask where the corresponding area on the photo-resist is fully exposed. The portion where a fraction of the total light intensity is emitted corresponds to a semi-transparent part of the mask where the corresponding area on the photo-resist is partially exposed. The SEM 120 receives a first set of mask data from a CPU 170.

A reduction optical system 140 is preferably provided to reduce the mask image projected on an integrated circuit wafer, or other workpiece, 150 so that higher image resolution can be achieved in a projection mode. The image reduction ratio can be chosen to adapt the pixel size on the mask 120 to the required pixel size on the wafer. If desired, a contact printing mode could be used, in which the mask is mounted in close proximity to the wafer and the optic 140 is not needed. The wafer 150 is coated with a layer of photoresist 155 and sits on top of a wafer handling mechanism 160, also controlled by controller 170. In this tool, there is no requirement for an external light source (or illuminator) and, as a result, the size of the tool can be made very compact. Cost advantages are realized as well. This figure shows the conventional representation, in which the wafer is at the bottom of the system. Less particle contamination will drop on the wafer if it is above (or to the side of) the other elements of the system. With the present invention, the compact design of the self-emitting mask permits such an inverted structure.

Figure 6A:
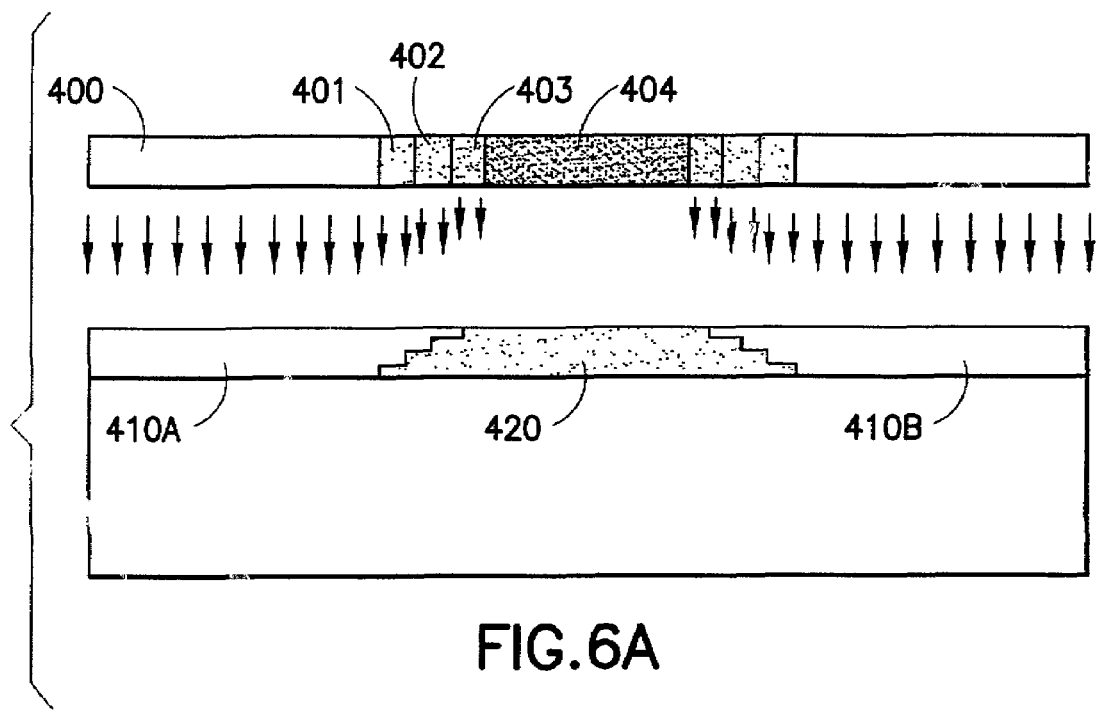
FIG. 6 illustrates exposures with different intensity.
Figure 6B:
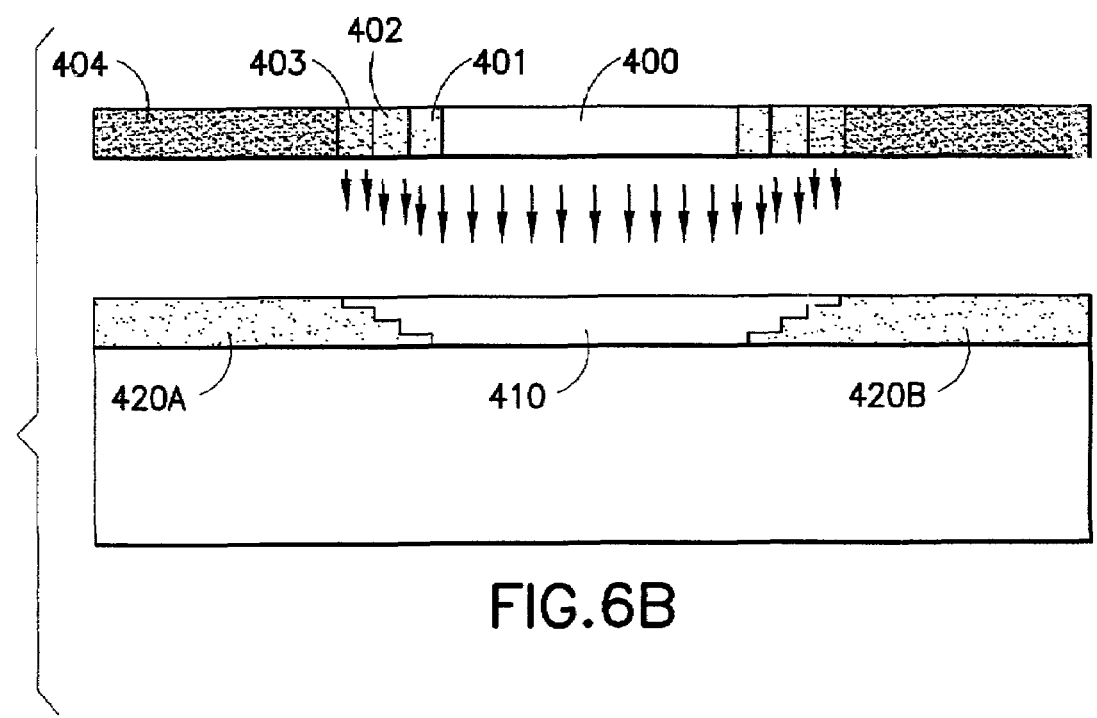

FIGS. 6A and 6B illustrate an optional use of the mask, in which shaded areas 404–400 denote a range from minimum to maximum exposure. With a negative resist, the exposure in FIG. 6A leaves a plug 420 with tapered sides and having areas 410a and 410B cleared from resist. In FIG. 6B, the inverse situation is an aperture 410 with tapered walls, bracketed with undisturbed resist 420A and 420B. The light distribution may be realized by applying different voltages to different light sources or by turning different sources on for longer or shorter times, depending on the type of source.

Those skilled in the art will appreciate that this invention lends itself to application-specific integrated circuits, in which the designs of the lower layers are common to many wafers, but the interconnections (or personalization layers) will be different for different customers. These circuits are typically needed only in small quantities, which may not justify the cost of a conventional set of several chrome on glass masks to define the interconnections. Masks according to the invention are well adapted to such short production runs. In addition, it will be appreciated that the light-emitting array does not need to cover the area of a whole chip. An array covering a fraction (¼, say) of a chip could be stepped over the chip surface and loaded with the appropriate data for each exposure.

In a preferred embodiment of the invention, a liquid crystal mask (LCM 130 in FIG. 1) is provided and aligned to the SEM 120 where a second set of mask data is fed from the same CPU 170. The combination of the SEM 120 and the LCM 130 forms a Hybrid Electronic Mask Module (HEMM) 125.

The hybrid electronic mask exhibits the advantages of the self-emitting mask (or SEM), and may be fabricated using an addressable, high-density LED array, or a laser diode array, or an e-beam emitter array. In addition, the programmable liquid crystal mask can be programmed to allow light to shine through different areas with different degrees of phase shifts. Therefore, by combining these two types of masks into the hybrid electronic mask, one is enabled to provide various mask types including a normal chrome mask in which no phase shift is produced, an attenuating mask in which the intensity of the light can be programmed, a phase shift mask in which light with different phases can be produced, and a combination of chrome, attenuation and phase shift masks to create optically sophisticated patterns.

One advantage of combining these two types of masks, as compared to using only one programmable liquid crystal mask, is that the likelihood of suffering thermal damage is minimized. In this case, the programmable liquid crystal mask allows light generated from the SEM mask to fully pass through. Therefore, minimal heat is generated within the mask due to the absorption of light. The stand-alone liquid crystal mask, in contradistinction, must block out light to form attenuated or opaque patterns, and it will thus absorb and accumulate heat that will eventually damage the mask. Therefore, the use of the hybrid electronic mask in accordance with these teachings significantly extends the service life of the mask.

Figure 2A:
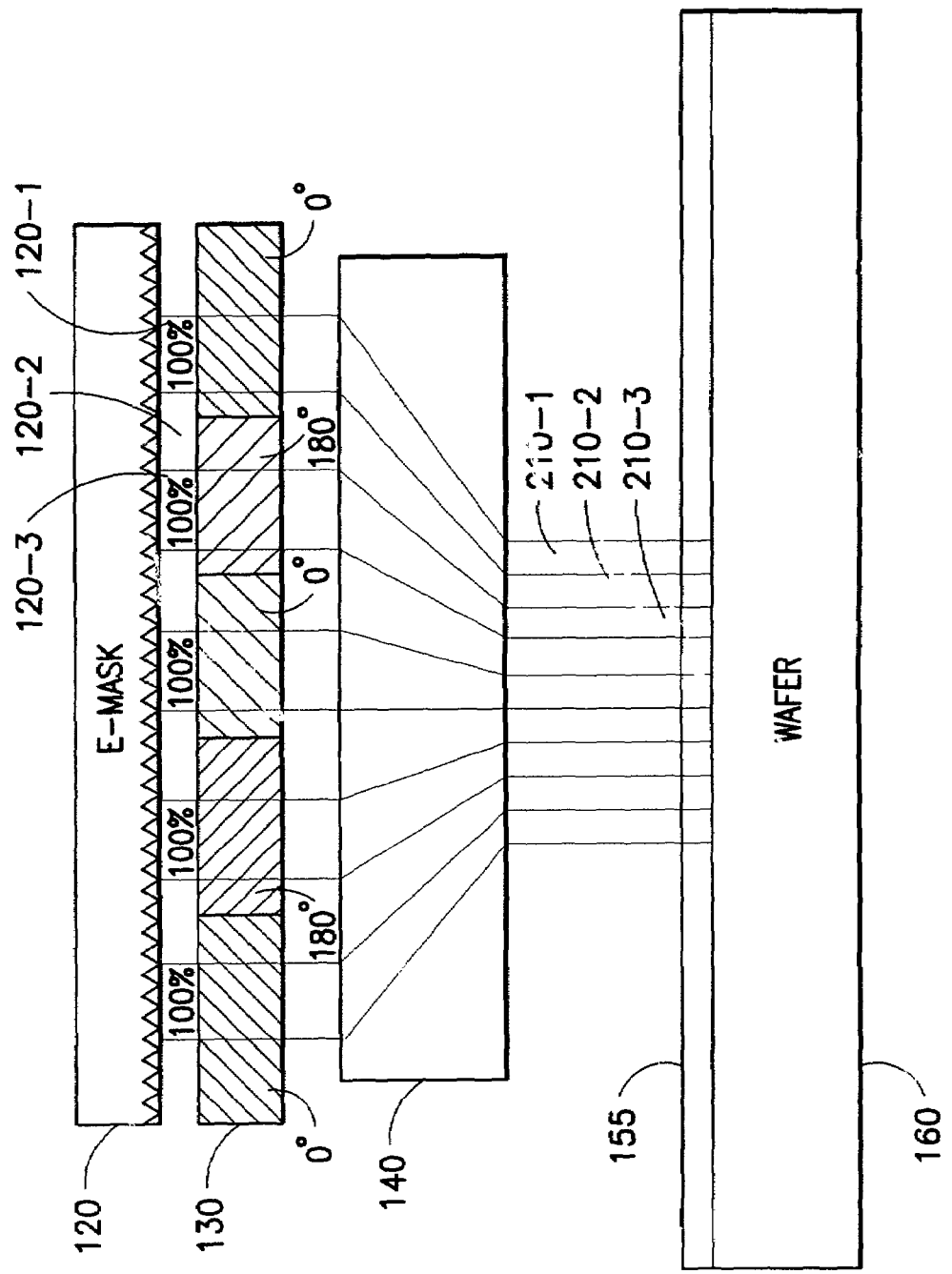
FIGS. 2A and 2B show a cross section of an alternative embodiment and associated phase shifts, respectively.

As an example of the use of the lithographic system 100, the creation of Levenson-type phase shift patterns is now described. As shown in FIG. 2A, the SEM 120 emits line patterns with 100% intensity (120-1 and 120-3) and space patterns with 0% intensity (120-2). In addition, the LCM 130 provides alternate 0 degree and 180 degree phase shifting windows for each line pattern generated from the SEM 120. As is illustrated in the figure, there may be several light sources that feed through an LCM pixel. The net result of the optical processing is a set of light intensity (and phase) distributions 210-1, 210-2 and 210-3. The resulting exposure patterns on the photoresist 155, which can be similar to those of a conventional equivalent phase shift mask, are shown in FIG. 2B as 210-1', 210-2' and 210-3'.

Figure 2B:
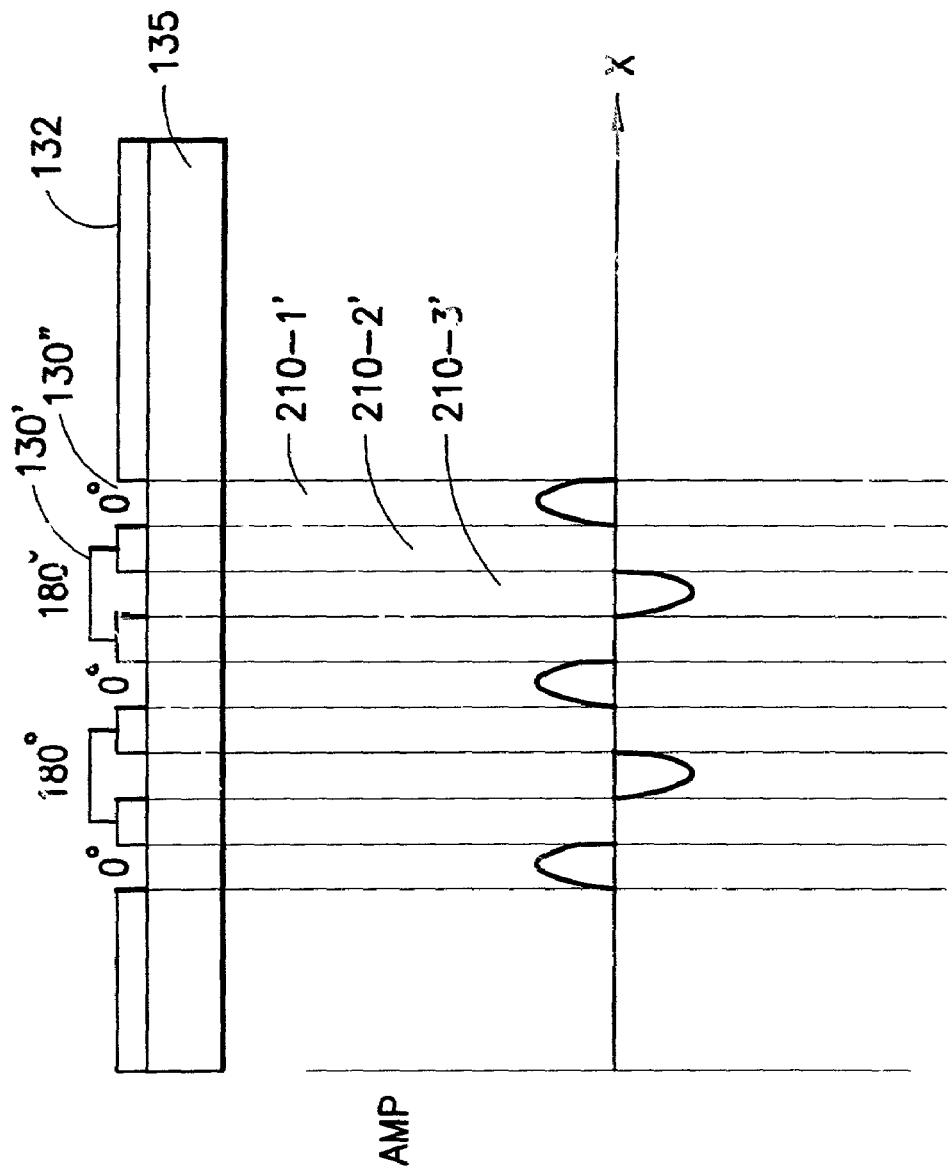

FIG. 2B also shows for illustrative purposes a Phase-Shift chrome mask that produces the same effect as the system in FIG. 2A. The equivalent phase shift mask can be considered to have a chrome mask 132 on quartz substrate 135 to block out the light to form spatial patterns of illumination, and to further have additional quartz regions 130' deposited to allow light to shift 180 degrees (or out-of-phase) while being transmitted through these associated openings. The remainder of the opening areas 130" allow light to fully transmit with a zero degree of phase shift. The arbitrary magnitude of phase (AMP) for the equivalent mask structure is shown in FIG. 2B plotted in cross-section in the x-direction.

In this example, two sets of mask data are required. The first set of mask data is used for programming the SEM 120 to define line and space areas. The second set of mask data is used by the LCM 130 to define the desired phase shift patterns. By overlapping the SEM 120 and the LCM 130 in the manner shown, an equivalent Levenson-type phase shift mask is created. Difficulties with adjoining areas of opposite phase are avoided by turning off the intensity in the space areas where there might be overlap between opposite phase shifts.

Figure 3A:
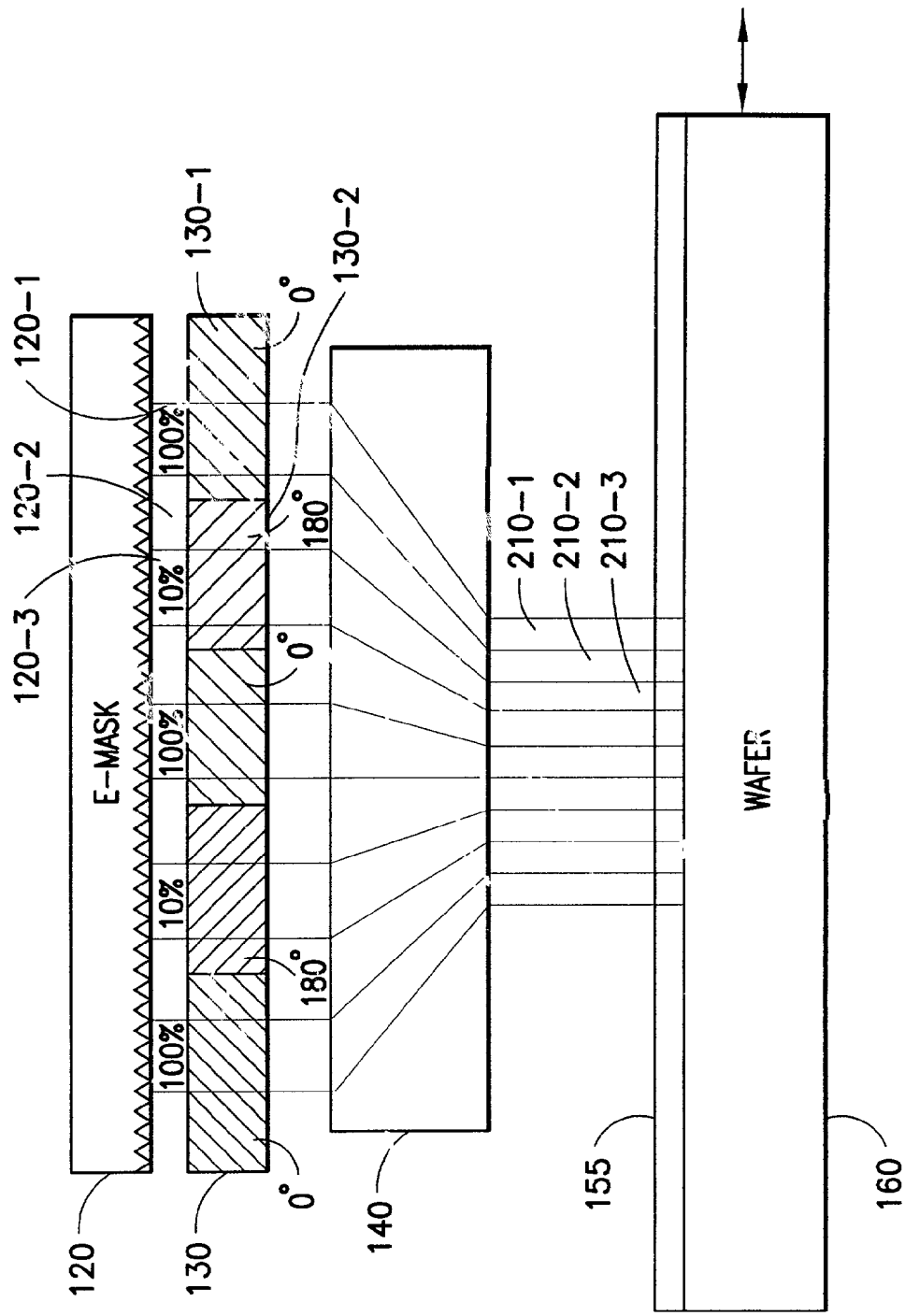

In a further example an equivalent Attenuation Phase Shift Mask (APSM) is provided by the HEMM 125. In this example, in addition to generating a phase shift mask, the HEMM 125 allows the designer to selectively attenuate light in certain areas. As is shown in FIG. 3A, the SEM 120 produces emitted light patterns with alternate 100% and 10% intensity (indicated by cross hatching). For convenience, and not by way of limitation, the phase shift patterns provided by the LCM 130 are unchanged from the first example shown in FIG. 2A.

The resulting exposure patterns, which are similar to that of a conventional phase shift mask, are shown in FIG. 3B. This equivalent phase shift mask can be considered to have a chrome mask 132 to block 100% of incoming light to form spatial illumination patterns, and two regions of dyed (light absorbing) quartz 137 that are deposited to allow light to shift 180 degrees (or out-of-phase) while also reducing the intensity by 90% of light transmitted through the associated openings. The remainder of the opening areas allow light to fully transmit with zero phase shift. The arbitrary magnitude of phase (AMP) is plotted in cross-section in the x direction, as in FIG. 2B. This example is provided to illustrate the capability of the HEMM 125, and is not intended to represent an actual pattern.

As in the example of FIGS. 2A and 2B two sets of mask data are required. The first set of mask data is used for programming the SEM 120 to define 100% light emitting lines, 10% light emitting lines and 0% light emitting space areas. By programming such addressable light emitting arrays, light intensity distribution can be made very flexible. The second set of mask data is used for programming the LCM 130 to define the phase shift patterns. By overlapping these two masks, an equivalent attenuate-type phase shift mask may be created. The figure of 10% is used as a short hand for a threshold amount of output. The amount of light transmitted does not have to be precise, so long as it is below an appropriate threshold. In addition, some pixels, referred to as buffer pixels, separate pixels of opposite phase, so that interference effects from adjacent pixels of opposite phase are suppressed.

Figure 4A:
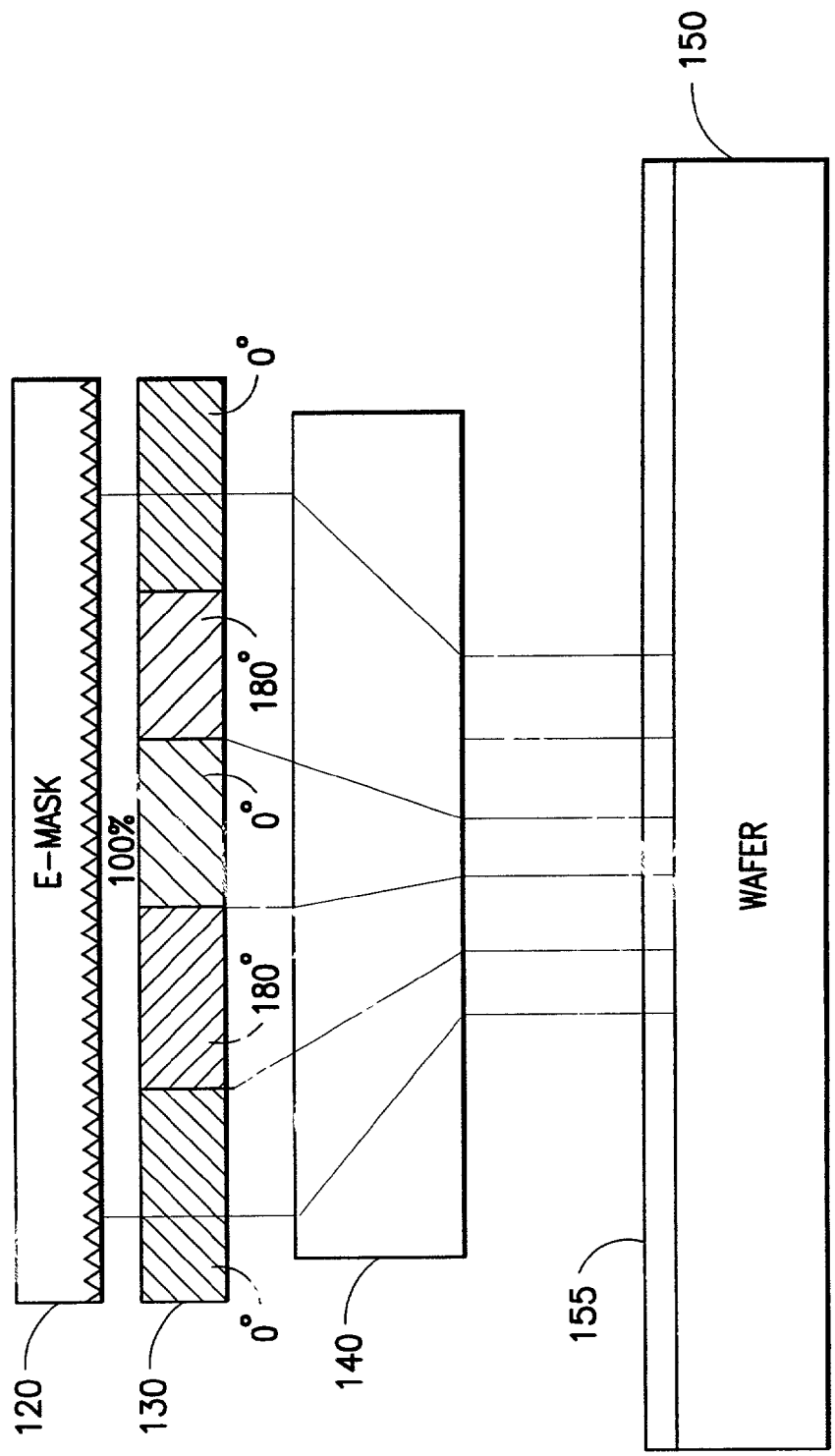
FIGS. 4a and 4B show a cross section of another alternative embodiment and associated phase shifts, respectively.
Figure 4B:
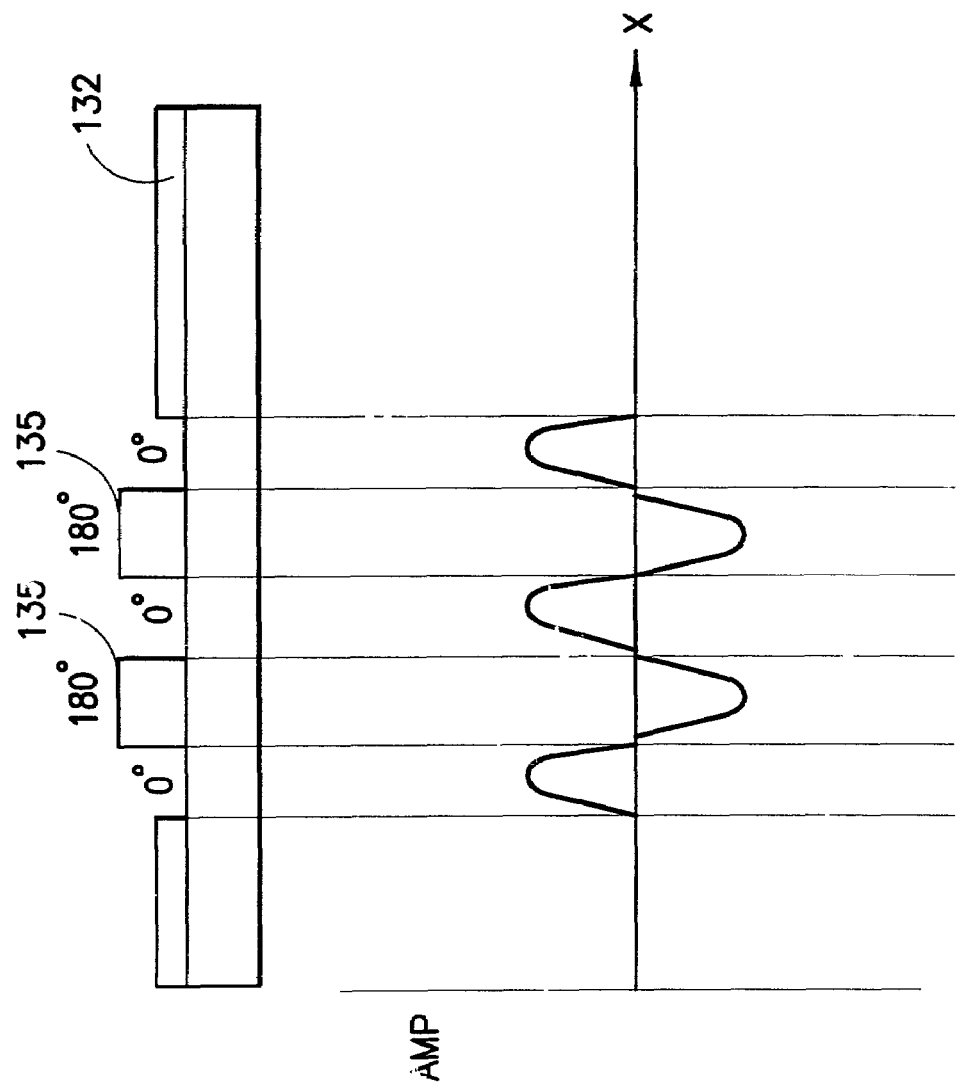

Referring now to FIGS. 4A and 4B for a further example, a phase edge mask provides sub-lithographic line patterning along the edge where two patterns with out-of-phase light are merged. In this case, the SEM mask 120 receives data to emit 100% light in at least one selected area. Again for convenience the phase shift patterns provided by the LCM 130 are unchanged from the first example of FIGS. 2A and 2B.

The resulting exposure patterns, which are similar to that of a conventional phase shift mask, are shown in FIG. 4B. Note that this equivalent phase shift mask has no chrome mask to block out light in the phase edge area, and that two pieces of additional quartz 135 are deposited to allow light to shift 180 degree (out-of-phase) while being transmitted through the two (equivalent) quartz areas. The remainder of the opening area allows light to be 100% transmitted with zero degree of phase shift. The AMP is plotted in cross-section in the x-direction and shows the sublithographic line patterns that are created in the areas along the edge of the open area where the phase changes from 0 degrees to 180 degrees and vice versa.

Figure 5:
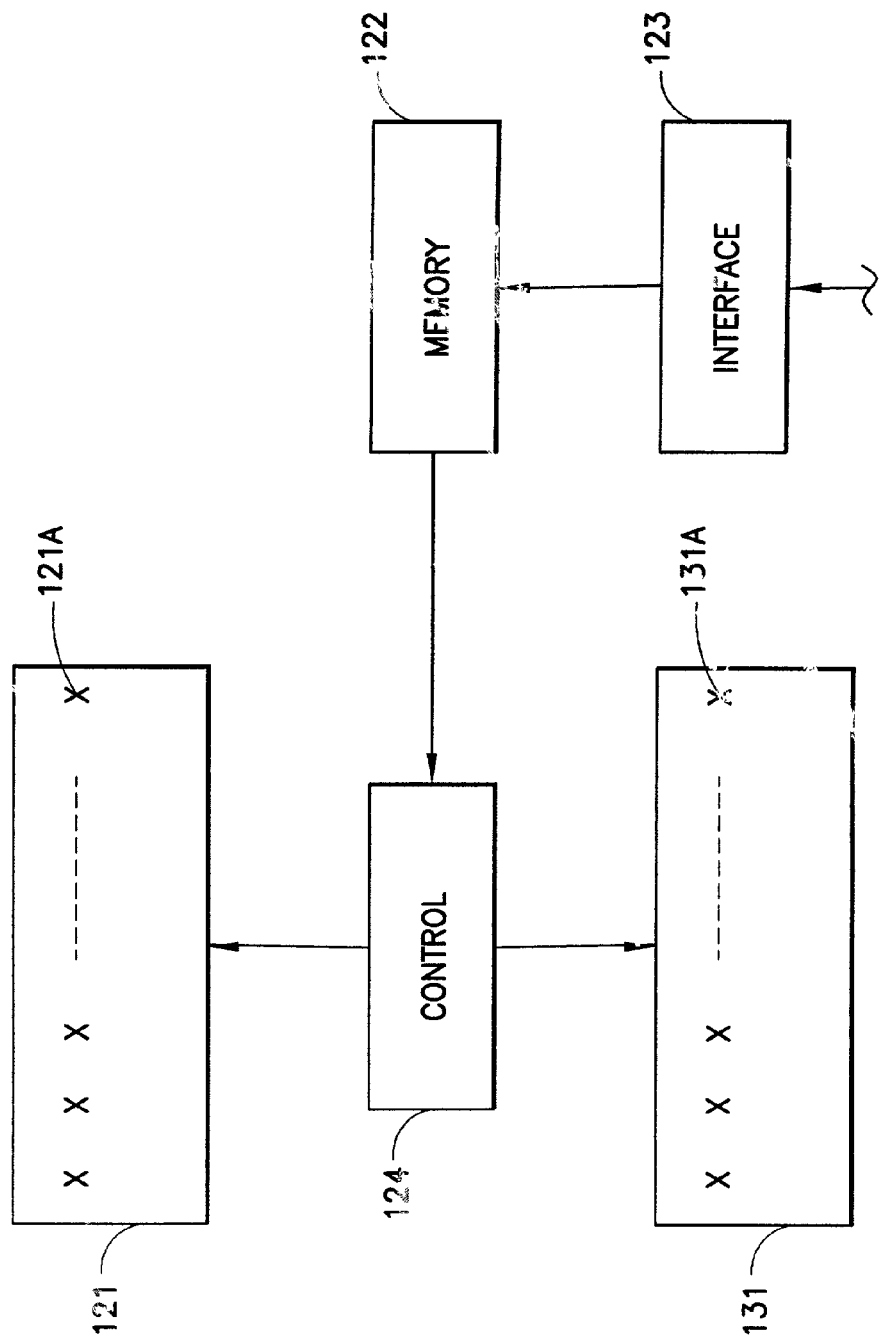
FIG. 5 shows a block diagram of part of an embodiment of the invention.

Referring to FIG. 5, there is shown data flow through the system, including an array 121 of emitters 121A, such as LEDs, laser diodes or e-beam emitters. A memory 122 stores the first set of mask data that is received from the processor 170 via a suitable interface 123. A local controller 124, such as a simple microprocessor, is responsive to the received first set of mask data for selectively turning on and off, and/or controlling the intensity of, individual pixels of the emitters 121A. If only on and off control is required then a single bit is sufficient for specifying the state of each emitter 121A, while if intermediate intensity control is desired then two or more bits can be used per emitter to specify the intensity.

Intensity or output control may be carried out by selectively changing the voltage applied to a light source or changing the duration of a light pulse. The cooling system 110 is thermally coupled to the emitter array 121 (as shown in FIG. 1) for removing heat generated during operation. Still referring to FIG. 5, the LCM 130 can include an array 131 of LC pixels 131A each of micron or submicron dimensions. The LCM 130 can be constructed in accordance with various conventional techniques As will be apparent to those skilled in the art, other phase shift mask patterns and styles can be produced by using the HEMM 125, wherein a hybrid mask includes a self-emitting mask (or SEM 120) and a liquid crystal mask (or LCM 130) that are used together. The SEM 120 is interfaced to an electronic device, such as the processor 170, to receive the first set of mask data for defining the light emitting patterns. The LCM 130 is also interfaced to a processor, typically the same processor 170, to receive the second set of mask data for defining the phase shift patterns. In that no external illumination source is needed, the lithographic exposure tool that includes the HEMM 125 can be very compact and reduced in cost and complexity. The exposure scheme can be both simple and flexible, and the HEMM 125 is capable of generating various types of phase shift patterns on a wafer. In that the LCM 130 can be always fully transparent to the light from the SEM 120, minimal heating and resultant thermal damage is experienced.

Although the invention has been discussed in terms of a limited number of embodiments, those skilled in the art will appreciate that other embodiments if the invention may be devised within the scope of the following claims.

What is claimed is:

1. Apparatus for generating a distribution of light intensity comprising:
   a set of individually controllable light sources capable of contact printing disposed in an array covering an object region of a transverse source plane positioned along an optic axis with respect to an image plane, and light from a selected set of illuminated light sources in said array exposes a corresponding set of selected pixels in said image plane;
   further comprising an array of individually controllable phase shift pixels aligned with said array of controllable light sources for illuminating and phase-shifting selected pixels; and
   further comprising output control means for controlling light output of selected pixels and in which a subset of buffer pixels of said array of controllable light sources are disposed between pixels of opposite phase, said subset of buffer pixels being controlled to have light output below a threshold amount.

2. Apparatus according to claim 1, further comprising a reduction optic disposed between said source plane and said image plane, whereby said corresponding set of selected pixels is reduced in area.

3. Apparatus according to claim 1, further comprising cooling means in thermal contact with said set of individually controllable light sources.

4. Apparatus according to claim 2, further comprising cooling means in thermal contact with said set of individually controllable light sources.

5. Apparatus according to claim 1 further comprising:
   cooling means in thermal contact with said array of light sources.

6. Apparatus according to claim 1, further comprising:
   optical means for forming a reduced image of said array of phase shift pixels on a workpiece.

7. Apparatus according to claim 5, further comprising:
optical means for forming a reduced image of said array of phase shift pixels on a workpiece.

8. Apparatus for generating a distribution of light intensity comprising:
a set of individually controllable light sources having substantially adjacent edges and capable of contact printing disposed in an array covering an object region of a transverse source plane positioned along an optic axis with respect to an image plane, whereby a selected set of illuminated light sources in said array expose a corresponding set of selected pixels in said image plane;
further comprising an array of individually controllable phase shift pixels aligned with said array of controllable light sources for illuminating and phase-shifting selected pixels; and
further comprising output control means for controlling light output of selected pixels and in which a subset of buffer pixels of said array of controllable light sources are disposed between pixels of opposite phase, said subset of buffer pixels being controlled to have light output below a threshold amount.

9. Apparatus according to claim 8, in which said threshold amount is substantially zero.

10. Apparatus according to claim 8, in which a subset of pixels have phase opposite to the phase of light in at least one adjacent pixel.

11. Apparatus according to claim 10, further comprising:
optical means for forming a reduced image of said array of phase shift pixels on a workpiece.

* * * * *